(12) United States Patent
Zhu et al.

(10) Patent No.: US 11,619,663 B2
(45) Date of Patent: Apr. 4, 2023

(54) METHOD FOR CALCULATING RADIO INTERFERENCE SUFFERED BY A COMMUNICATION DEVICE MOUNTED ON AN ELECTRIC POWER TOWER

(71) Applicants: STATE GRID JIANGSU ELECTRIC POWER CO. LTD., Jiangsu Province (CN); STATE GRID NANJING SUPPLY POWER COMPANY, Jiangsu Province (CN); State Grid Jiangsu Electric Power Co. Ltd. Marketing Center, Jiangsu Province (CN)

(72) Inventors: Hong Zhu, Jiangsu Province (CN); Xiaohong Kong, Jiangsu Province (CN); Jing Chen, Jiangsu Province (CN); Dongxu Zhou, Jiangsu Province (CN); Jian Du, Jiangsu Province (CN); Shaojun Liu, Jiangsu Province (CN); Weiya Zhang, Jiangsu Province (CN); Yichen Pi, Jiangsu Province (CN); Linqing Yang, Jiangsu Province (CN); Wendi Wang, Jiangsu Province (CN); Qiusheng Li, Jiangsu Province (CN); Mingchi Shao, Jiangsu Province (CN); Yufeng Zou, Jiangsu Province (CN); Jun Hu, Jiangsu Province (CN)

(73) Assignees: STATE GRID JIANGSU ELECTRIC POWER CO., LTD., Jiangsu Province (CN); STATE GRID NANJING SUPPLY POWER COMPANY, Jiangsu Province (CN); STATE GRID JIANGSU ELECTRIC POWER CO. LTD. MARKETING CENTER, Jiangsu Province (CN)

( * ) Notice: Subject to any disclaimer, the term of this patent is extended or adjusted under 35 U.S.C. 154(b) by 318 days.

(21) Appl. No.: 17/002,074

(22) Filed: Aug. 25, 2020

(65) Prior Publication Data
US 2021/0132132 A1 May 6, 2021

(30) Foreign Application Priority Data
Oct. 31, 2019 (CN) .......................... 201911056583.9

(51) Int. Cl.
*G01R 29/08* (2006.01)
*H04B 17/345* (2015.01)

(52) U.S. Cl.
CPC ..... *G01R 29/0892* (2013.01); *G01R 29/0871* (2013.01); *H04B 17/345* (2015.01)

(58) Field of Classification Search
CPC ............ G01R 29/0814; G01R 29/0871; G01R 29/0892; G06Q 50/32; H04B 17/345
See application file for complete search history.

(56) References Cited

PUBLICATIONS

Crane, Radio Frequency Interference From Extra High Voltage Transmission Lines, 2010 (Year: 2010).*

(Continued)

*Primary Examiner* — Kyle R Quigley
(74) *Attorney, Agent, or Firm* — Burns & Levinson, LLP; Joseph M. Maraia

(57) ABSTRACT

Disclosed is a method for calculating radio interference suffered by a communication device mounted on an electric power tower. The method includes: establishing a relative position model of the communication device mounted on the electric power tower and transmission lines, calculating interference field strength of the communication device on the electric power tower, and determining whether the radio interference field strength at the mounting point satisfies the requirements.

6 Claims, 3 Drawing Sheets

(56) References Cited

PUBLICATIONS

Gruber, Power Line Noise, ARRL, 2010 (Year: 2010).*
Madge et al., Effect of Power Lines on AM Radio Broadcast Radiation Patterns, IEEE, 1986 (Year: 1986).*
CN106443276A machine translation (Year: 2017).*
CN102608462B machine translation (Year: 2014).*

* cited by examiner

METHOD FOR CALCULATING RADIO INTERFERENCE SUFFERED BY A COMMUNICATION DEVICE MOUNTED ON AN ELECTRIC POWER TOWER

CROSS-REFERENCE TO RELATED APPLICATIONS

This application claims priority to Chinese patent application No. CN201911056583.9 filed with CNIPA on Oct. 31, 2019, the disclosure of which is incorporated herein by reference in its entirety.

TECHNICAL FIELD

The present disclosure belongs to the technical field of mobile communications, and is a method for calculating radio interference suffered by a communication device mounted on an electric power tower.

BACKGROUND

In June 2019, the Ministry of Industry and Information Technology officially issued 5G commercial licenses, which marks the first year for China to officially enter 5G commercialization, and operators have begun to promote 5G network deployment. Because of the high frequency band used by 5G, the coverage of base stations is small and the density is high, and the number of base stations will reach 3 to 4 times the number of base stations in 4G. There is no room for 5G base station devices in some of the existing sites, and the difficulty in site selection and land acquisition for new sites has become the bottleneck restricting the rapid deployment of 5G networks. In view of this drawback, one way is to mount the base station devices on electric power towers, so as to solve the pain point of insufficient station sites and nowhere to place devices. At present, in some cities, electric power towers have been shared for deployment of 5G base stations to promote the 5G construction process while saving resources. However, the electromagnetic radiation generated by high-voltage power lines may interfere with the normal operation of communication devices mounted on the electric power towers. It is necessary to calculate the radio interference suffered by the communication devices mounted on the electric power towers. However, research has not yet been carried out in China.

SUMMARY

The present disclosure aims to study the radio interference situation of the communication devices mounted on the electric power towers according to the objective requirements of the related art, and provide technical support for realizing the co-mounting of the base station communication devices and the electric power towers.

The present disclosure provides a method for calculating radio interference suffered by a communication device mounted on an electric power tower, which includes the following steps.

1) According to an erection method of electric power towers and electric transmission lines, a radio interference field strength calculation method to be used is determined, an interference value is calculated, and the number of charges on a surface of each wire is calculated.

2) An approximate cutting model for a sag of a wire between two electric power towers is established, the each wire with the sag as a circular arc is equated, and the circular arc is divided into m segments to make each segment of the circular arc equal to a horizontal straight segment, and the number of charges in each segment according to a segmentation weight is linearly allocated.

3) Each segment is calculated according to the radio interference field strength calculation method, a calculated value is substituted into a formula for lateral change of interference field strength, and an interference field strength component of each segment at an observation point is obtained, where the observation point is a mounting point prepared for a communication device.

4) Interference field strength components generated by the segments of the each wire are geometrically superimposed, and then interference field strength values obtained from same-name phase wires of different loops are vectorially superimposed.

5) An interference field strength of a corresponding frequency is calculated from a radio interference field strength at 0.5 MHz from step 4) by using a formula of field strength changing with frequency.

6) It is determined whether the radio interference field strength at the mounting point satisfies requirements, when the radio interference field strength satisfies the requirements, the mounting point is capable of mounting the communication device mounted; and when the radio interference field strength does not satisfy the requirements, the mounting point is lowered and the steps are repeated until the requirements are satisfied.

In view of the vacancies of the related art, the present disclosure proposes two ways as described below.

First, at present the construction of the installation position model of the communication device mounted on the electric power towers is relatively blank in China, and the research on the calculation of the electromagnetic interference of the power transmission line suffered by the mounted communication device is relatively scarce. The present disclosure proposes a model of a communication device mounted on electric power towers, and a research on the calculation of radio interference intensity is carried out based on this model. This research on calculation, which is based on the excitation function calculation method and in combination with the specific model proposed in the present disclosure, can calculate the radio interference intensity generated by each transmission line at different frequencies, and superimpose the calculation results of different wires, so as to determine whether the radio interference value of the mount point satisfies the requirements according to the standards issued by General Administration of Quality Supervision, Inspection and Quarantine of the People's Republic of China and China National Standardization Management Committee.

Second, the sag of the transmission wire causes interference to the calculation. The wire will sag due to its own weight. Most of the traditional radio interference calculation schemes are performed for a calculation point at a height of 2 meters from the ground, and 20 meters away along the projection of the transmission wire to the ground. The sag of the wire has relatively little interference to the calculation result, at this time, the wire bent due to its own weight can also be approximated as a straight line. The influence of the sag on the observation point under the tower can be compensated by directly changing the ordinate of the wire to the bottom of the sag. However, in the model of the communication device mounted on the electric power towers proposed by the present disclosure, the self-bending wire is usually not approximated as a straight wire. The reason is that the observation point on the tower is closer to sub-wires, especially the ratio of the longitudinal distance to the lateral distance is greatly reduced, which makes it difficult to ignore the calculation error caused by sag. The present disclosure establishes an approximate model, which segments the transmission line with sag based on the idea of differentiation, which effectively compensates for the calculation error caused by the sag of the wire, and improves the calculation accuracy of the radio interference suffered by the communication device mounted on the tower.

The method for calculating radio interference suffered by a communication device mounted on an electric power tower proposed in the present disclosure can more accurately calculate the radio interference intensity of the transmission line received at the mounting point on the electric power towers to determine whether the radio interference intensity will affect the operation of the device and provide technical support for the base station communication device mounted on the electric power towers.

DETAILED DESCRIPTION

Figure 1:
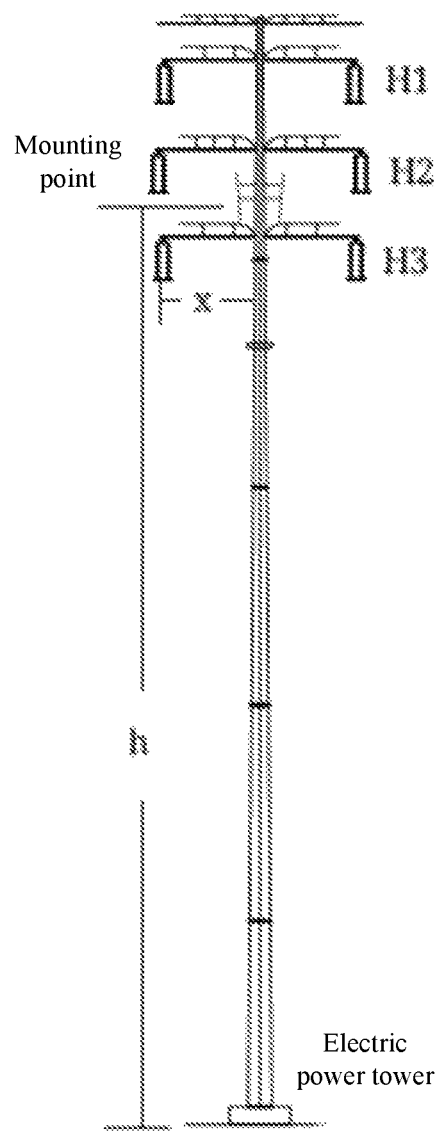
FIG. 1 is a schematic diagram of a relative position between a mounting point of a communication device on an electric power tower and electric wires.

Regarding the requirements of the related art, the present disclosure provides a method for calculating radio interference suffered by a communication device mounted on an electric power tower, which includes the following steps.

1) According to an erection method of electric power towers and electric transmission lines, a radio interference field strength calculation method to be used is determined, an interference value is calculated, and the number of charges on a surface of each wire is calculated.

2) An approximate cutting model for a sag of a wire between two electric power towers is established, the each wire with the sag as a circular arc is equated, and the circular arc is divided into m segments to make each segment of the circular arc equal to a straight segment, and the number of charges in each segment according to a segmentation weight is linearly allocated.

3) Each segment is calculated according to the radio interference field strength calculation method, a calculated value is substituted into a formula for lateral change of interference field strength, and an interference field strength component of each segment at an observation point is obtained, where the observation point is a mounting point prepared for a communication device.

4) Interference field strength components generated by the segments of the each wire are geometrically superimposed, and then interference field strength values obtained from same-name phase wires of different loops are vectorially superimposed.

5) An interference field strength of a corresponding frequency is calculated from a radio interference field strength at 0.5 MHz from step 4) by using a formula of field strength changing with frequency.

6) It is determined whether the radio interference field strength at the mounting point satisfies requirements, when the radio interference field strength satisfies the requirements, the mounting point is capable of mounting the communication device mounted; and when the radio interference field strength does not satisfy the requirements, the mounting point is lowered and the steps are repeated until the requirements are satisfied.

The implementation of the present disclosure will be specifically described below.

There are two calculation methods for radio interference, including an empirical formula method and an excitation function method. The empirical formula method may be used for wires of four or fewer splits, and the excitation function method is used more widely. The method is selected according to the actual erection situation. The formulas are as follows.

The empirical formula method is:

$$E = 30.3 M \delta^{\frac{2}{3}} \left(1 + \frac{0.3}{\sqrt{r}}\right),$$

where M is a linear coefficient, δ is an empirical formula calculation constant, E is a radio interference intensity, and r is a radius of the sub-wire.

The excitation function method is:

$$E = 3.5\, g_{maxi} + 12 r_i - 30 + 33 lg \frac{20}{D_i},$$

where $g_{maxi}$ is a maximum surface electric field strength of wire i, in units of kV/cm; $r_i$ is a radius of wire i, in unites of cm; $D_i$ is a distance from the observation point to wire i, in units of m; a calculation result E is the intensity of radio interference, in units of dB(μV/m). The calculation formula of $g_{maxi}$ is:

$$\begin{cases} g_{max} = g\left[1 + (n-1)\frac{d}{R}\right] \\ \quad g = \dfrac{Q}{\pi \varepsilon_0 d n} \end{cases},$$

where g is an average potential gradient on the wire surface, in units of kV/cm; n is the number of sub-wires; d is a diameter of the sub-wire, in units of cm; R is a diameter of the splitting wire, in units of cm; Q is an equivalent total charge of the wire, and the matrix form of the equivalent total charge is calculated as the product of a Maxwell potential inverse matrix and a single-column matrix of the voltage to ground of each wire, namely $[Q]=[P]^{-1}[U]$.

Figure 2:
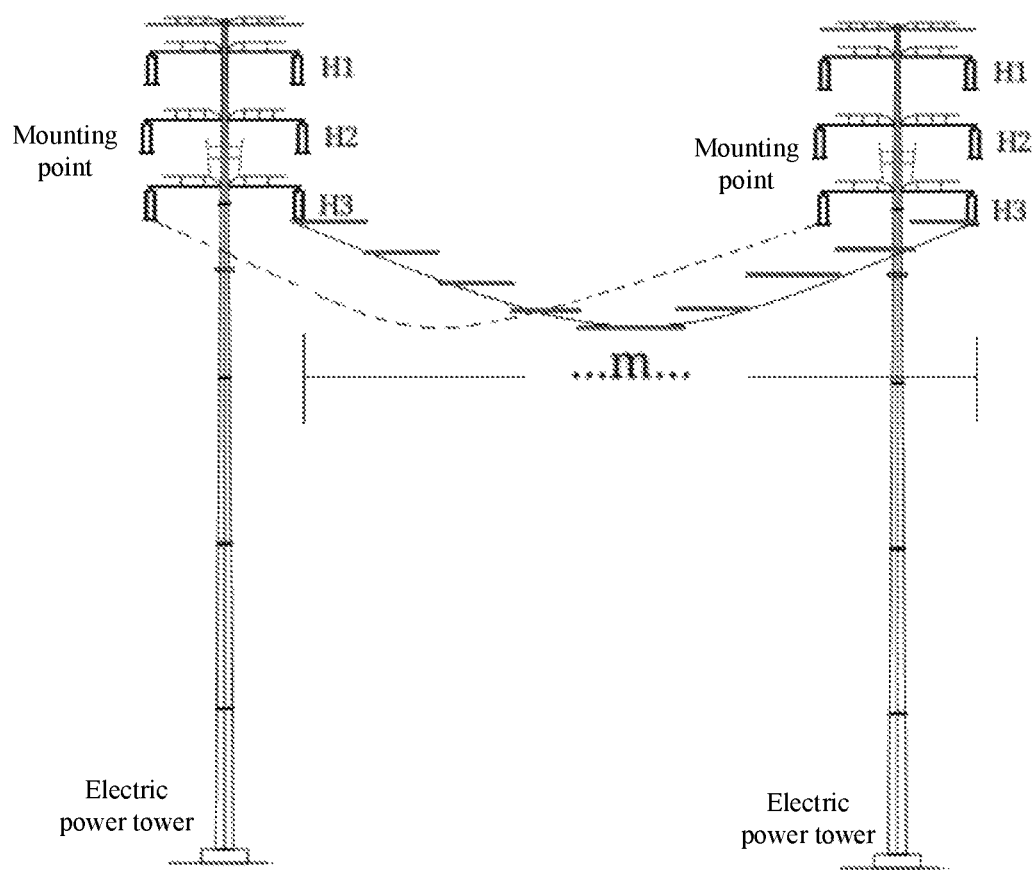
FIG. 2 is an approximate cutting model of a wire sag between two electric power towers.
Figure 3:
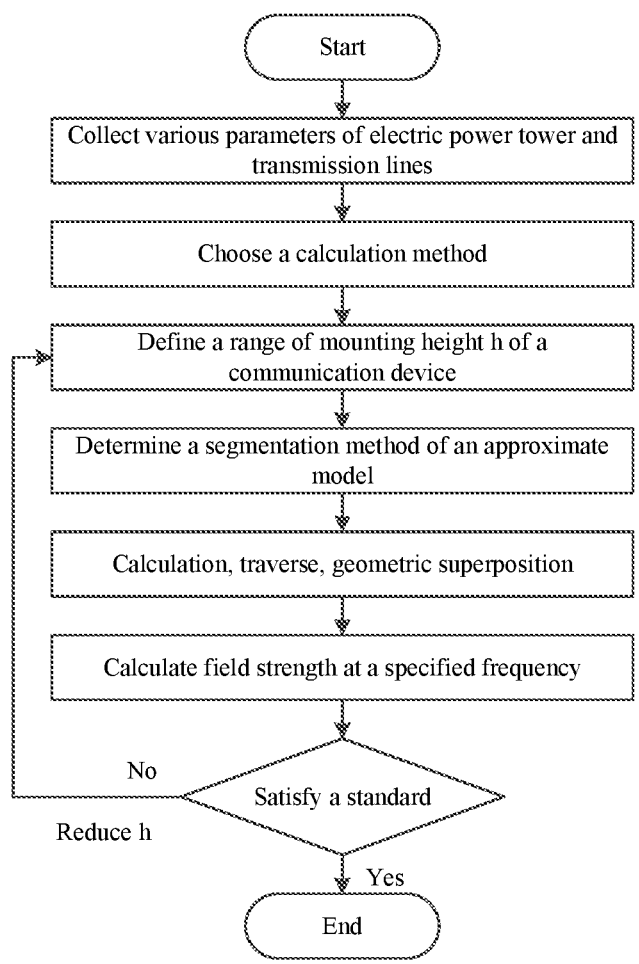
FIG. 3 is a flowchart of an embodiment of the present disclosure.

Approximate Sag Model:

The approximate sag model proposed by the present disclosure is shown in FIG. 2. The wire with sag is equivalent to a circular arc, and the idea of differentiation is used to divide the wire into m segments. Since the curvature of each segment is relatively small, each segment of the wire can be equivalent to a horizontal straight segment. Since the sag model of the wire is symmetrical to each other, and the horizontal straight segment of the segment is most conducive to approximate calculation. The radio interference field strength of each segment to the device at the observation point can be calculated by the excitation function method, and then the radio interference field generated by each segment at the observation point is geometrically superimposed to obtain the radio interference field strength generated by the wire at the observation point, this process is repeated for each sub-wire of the power tower, and finally the field strength of respective sub-wires are vectorially superimposed. Regarding the value of the divided m segments, the bending degree of the wire in specific cases needs to be referenced. If the bending degree is large, the number m of divided segments should also be increased appropriately to obtain a more accurate result. The total amount of charges of the wire are distributed to the divided wire segments according to their division weights.

The calculation of the lateral change of interference intensity is:

$$E_x = E + k l g \frac{400 + (H-h)^2}{x^2 + (H-h)^2},$$

where $E_x$ is a radio interference intensity at the lateral distance x of the each wire, H is an altitude of a corresponding segment of the wire; as shown in FIG. 1 and FIG. 2, h is an altitude of the mounting point of the communication device on the electric power tower; x is a lateral distance between the mounting point and the each wire or a cut section of the each wire; k is a change coefficient, and has a value of 16.5; and E is the interference value calculated by the excitation function method or the empirical formula method.

The geometric superimposition formula is:

$$E_i = 20 l g \left[ \left(10^{\frac{E_{i1}}{20}}\right)^2 + \left(10^{\frac{E_{i2}}{20}}\right)^2 + \ldots + \left(10^{\frac{E_{im}}{20}}\right)^2 \right]^{\frac{1}{2}},$$

where $E_i$ is a value of radio interference generated by a i-th wire, $E_{im}$ is a value of radio interference generated by the first to m-th segments of the i-th wire.

Calculation of relative interference field strength with frequency:

$$\Delta E_f = 5[1 - 2(lg10f)^2].$$

The calculation result of this formula is the difference between an interference field strength at the frequency f and an interference field strength at 0.5 MHz.

EXAMPLES

Assuming that a communication device is to be mounted at a height of 31.5 m on a same four-circuit electric power tower, and the transmission line erection model is known, the radio interference field strength is required. After the excitation function method is selected and the approximate segmentation model is determined, according to the excitation function method, the field strength is obtained as 62.40 dB, according to the lateral change, the field strength at the mounting point on the 0.5 MHz is calculated as 90.35 dB, and according to the spectrum characteristics, the interference field strength at 30 MHz is calculated as 34 dB. Referring to the national standard radio interference peak value (30 dB) at 30 MHz, the interference field strength exceeds the standard, and therefore the mounting point position is lowered and the point-taking calculation is re-executed until the interference field strength drops below the national standard peak value.

As mentioned above, the calculation method for radio interference suffered by the communication device mounted on the electric power towers provided in the proposal of the present disclosure provides an effective method to verify whether the radio interference assignment at the mounting point satisfies the standard. This can improve the efficiency of mounting communication devices on the electric power towers, accelerate the process of 5G construction, and save more social resources during the construction process.

What is claimed is:

1. A method for calculating radio interference suffered by a communication device mounted on an electric power tower, comprising:
    1) determining, according to an erection method of electric power towers and electric transmission lines, a radio interference field strength calculation method to be used, calculating an interference value, and calculating a number of charges on a surface of each wire;
    2) establishing an approximate cutting model for a sag of a wire between two electric power towers, equating the each wire with the sag as a circular arc, and dividing the circular arc into m segments to make each segment of the circular arc equal to a horizontal straight segment, and linearly allocating a number of charges in each segment according to a segmentation weight;
    3) calculating each segment according to the radio interference field strength calculation method, substituting a calculated value into a formula for lateral change of interference field strength, and obtaining an interference field strength component of each segment at an observation point, wherein the observation point is a mounting point prepared for a communication device;
    4) geometrically superimposing interference field strength components generated by the segments of the each wire, and then vectorially superimposing interference field strength values obtained from same-name phase wires of different loops;
    5) calculating an interference field strength of a corresponding frequency from a radio interference field strength at 0.5 MHz from step 4) by using a formula of field strength changing with frequency;
    6) determining whether the radio interference field strength at the mounting point satisfies requirements, wherein when the radio interference field strength does not satisfy the requirements, the mounting point is lowered and the steps are repeated until the requirements are satisfied, and
    7) wherein when the radio interference field strength satisfies the requirements, the communication device is mounted at the mounting point.

2. The method for calculating the radio interference suffered by the communication device mounted on the electric power tower of claim 1, wherein the radio interference field strength calculation method in step 1) comprises an empirical formula method and an excitation function method.

3. The method for calculating the radio interference suffered by the communication device mounted on the electric power tower of claim 1, wherein in step 2), the m segments are determined by means of a differential principle making a combination of the segments approach to a line shape of the each wire.

4. The method for calculating the radio interference suffered by the communication device mounted on the electric power tower of claim 1, wherein the formula for lateral change of interference field strength is:

$$E_x = E + k l g \frac{400 + (H-h)^2}{x^2 + (H-h)^2},$$

wherein $E_x$ is a radio interference intensity at the lateral distance x of the each wire, H is an altitude of a corresponding segment; h is an altitude of the mounting point of the communication device on the electric power tower; x is a lateral distance between the mounting point and the each wire or a cut section of the each wire; k is a change coefficient, and has a value of 16.5; and E is the interference value calculated by the excitation function method or the empirical formula method.

5. The method for calculating the radio interference suffered by the communication device mounted on the electric power tower of claim 1, wherein the geometrically superimposing in step 4) is:

$$E_i = 20 lg \left[ \left(10^{\frac{E_{i1}}{20}}\right)^2 + \left(10^{\frac{E_{i2}}{20}}\right)^2 + \ldots + \left(10^{\frac{E_{im}}{20}}\right)^2 \right]^{\frac{1}{2}},$$

wherein $E_i$ is a radio interference value generated by a i-th wire, $E_{im}$ is a radio interference value generated by a first segment to a m-th segment of the i-th wire.

6. The method for calculating the radio interference suffered by the communication device mounted on the electric power tower of claim 1, wherein the formula of field strength changing with frequency is:

$$\Delta E_f = 5[1-2(lg10f)^2],$$

a calculation result of this formula is the difference between an interference field strength under frequency f and an interference field strength at 0.5 MHz.

* * * * *